United States Patent [19]

Molyneaux et al.

[11] Patent Number: 5,138,260
[45] Date of Patent: Aug. 11, 1992

[54] COMPUTER CONTROLLED SWITCHING OF MULTIPLE RF COILS

[75] Inventors: David A. Molyneaux, Willowick; William McLemore, Cleveland, both of Ohio

[73] Assignee: Picker International, Inc., Highland Hts., Ohio

[21] Appl. No.: 616,890

[22] Filed: Nov. 21, 1990

[51] Int. Cl.$^5$ .............................................. G01R 33/20
[52] U.S. Cl. ...................................................... 324/309
[58] Field of Search ............... 324/300, 307, 309, 310, 324/311, 312, 313, 314, 318, 322; 128/653 A, 653 SC

[56] References Cited

U.S. PATENT DOCUMENTS

| | | | |
|---|---|---|---|
| 4,728,896 | 3/1988 | Bendall et al. | 324/318 |
| 4,812,761 | 3/1989 | Vaughan | 324/307 |
| 4,825,162 | 4/1989 | Roemer et al. | 324/318 |
| 4,881,034 | 11/1989 | Kaufman et al. | 324/318 |
| 4,885,541 | 12/1989 | Hayes | 324/322 |
| 4,975,644 | 12/1990 | Fox | 324/318 |
| 5,086,275 | 2/1992 | Roemer | 324/309 |

Primary Examiner—Michael J. Tokar
Attorney, Agent, or Firm—Fay, Sharpe, Beall, Fagan, Minnich & McKee

[57] ABSTRACT

A whole body RF antenna (22) surrounds an examination region (14). A localized coil array (40) having a plurality of coils (42a, 43b, ...) is mounted in the examination region. A switch array (48) selectively connects a selected one of the coils with an output (46). In a pilot or alignment scan, an imaging sequence is conducted using the whole body antenna (22) to generate an image of a portion of the surface coil array and the patient in the examination region. The coil array includes a marker (82) that is readily identifiable in the resultant image displayed on a video monitor (36). The location of slices for more detailed imaging are selected by positioning a cursor (64) on the video display. The position or coordinate system of the selected slices is aligned with the position or coordinate system of the coil array by positioning the cursor over the image of the marker and noting its position. Properties or parameters of each coil of the array are stored in a look up table (74). The parameters of each selected slice and imaging sequence are compared (72) with the properties in the look up table in order to determine an optimal one or more of the coils (42) for use in each imaging sequence. An imaging sequence along each of the slices is conducted utilizing the corresponding selected coils.

18 Claims, 4 Drawing Sheets

COMPUTER CONTROLLED SWITCHING OF MULTIPLE RF COILS

BACKGROUND OF THE INVENTION

The present invention relates to magnetic resonance systems. It finds particular application in conjunction with magnetic resonance systems for imaging a patient's spinal column and will be described with particular reference thereto. However, it is to be appreciated that the invention will also find application in conjunction with imaging other areas of a human or non-human subject, spectroscopically analyzing regions of a subject, and the like.

Conventionally, large, patient encircling whole body coils are utilized when imaging large areas of a patient. When imaging a limited, specific region of the patient, a single surface coil is commonly utilized to receive signals from a smaller the region of interest. The single surface coil may have multiple elements, all of which are active and work concurrently as a single receiving coil.

Various techniques have been developed which take advantage of a surface coil's sensitivity to only a small region when imaging larger regions. In one technique illustrated in "Coil Holder and Marker System for MR Imaging of the Total Spine", Abrahams, et al., Radiology, Volume 172, No. 3, pages 869-871, Sep. 1989, the surface coil was physically moved from location to location. This enabled each image slice to be positioned appropriately within the field of view of the surface coil.

In the technique illustrated in "Parallel Image Acquisition from Non-Interacting Local Coils", Hyde, et al., Journal of Magnetic Resonance, Volume 70, pages 512-517, 1986, two surface coils were active concurrently and their outputs combined. One disadvantage of this technique is that it introduced extraneous noise into the system. Specifically, when data was collected to generate a slice within the field of view of one of the coils, the other coil was active and received noise or extraneous signals that were superimposed on the signals from the one coil.

One method to avoid summing the output of plural surface coils, was to provide a manual switch for selecting only a single coil to be active at a time. See for example, "Faraday Shielded Switchable Surface Coils Arrays", Molyneaux, et al., SMRI, 1989 Meeting Program and Abstracts, Abstract No. 340, Jul. 1989, U.S. Pat. No. 4,924,868 to Krause, et al.

Automated switching was suggested in "Switched Array Coils", Requardt, et al., Magnetic Resonance in Medicine, Volume 13, pages 385-397, (1990). One of the disadvantages of the Requardt system is that it utilized a hardware card with fixed precoding. Coil and sequence information were hard coded on the card. Modification of the machine was also required. Another disadvantage of this scheme resided in its lack of flexibility. The user was not allowed to define where to put slices, what type of imaging sequences to be run, and the nature of the coils to be used. No provision was made for user parameter selection. Second, the Requardt, et al. system performed the disclosed imaging operations alone, not in conjunction with a conventional whole body coil. The inability to activate the whole body coil rendered it difficult to determine the exact position of the coils and resultant images relative to the whole patient.

The present invention contemplates a new and improved computerized coil switching arrangement which overcomes the above-referenced problems and others.

SUMMARY OF THE INVENTION

In accordance with one aspect of the present invention, a magnetic resonance apparatus that creates a primary magnetic field and magnetic field gradients across an examination region is provided. A whole examination region antenna transmits radio frequency signals into and receives radio frequency resonance signals from the examination region. A transmitter selectively supplies radio frequency signals to the whole region antenna. A localized coil array which includes a plurality of independently operable coils and a switching means for selectively interconnecting each coil with a radio frequency receiver is disposed in the examination region. A data reconstruction means process data received by the receiver. The processed data is stored in a memory means for selective display on a video monitor. An operator enters magnetic resonance procedure and sequence information on an operator console. An automatic coil selection means controls the switching means to select among the coils in accordance with the operator selected procedure and sequence information.

In accordance with a more limited aspect of the present invention, the automatic selection means includes a coil parameter or property look up table means for storing at least one property of each coil of the array. A comparing means compares the stored coil properties with the procedure and sequence information.

In accordance with another more limited aspect of the present invention, an aligning means aligns coordinate systems of the examination region and the coil array.

In accordance with a still more limited aspect of the present invention, the aligning means includes a marker mounted in the coil array such that the marker is identifiable in the video monitor display. A trackball means controls movement of a cursor on the video monitor display. By aligning the cursor with the marker on the video monitor display, the correlation between the coil array and the examination region coordinate systems is determinable.

In accordance with another aspect of the present invention, a method of magnetic resonance imaging is provided. A local coil array is disposed in an imaging region in a whole imaging region RF antenna. A portion of a subject to be imaged is disposed in the imaging region. Magnetic field gradients are caused to cross the imaging region and radio frequency signals are applied through the whole region coil to excite magnetic resonance of select dipoles of the subject. Magnetic resonance signals are received with the whole region coil and reconstructed into a first image representation of a portion of the subject and the coil array in the imaging region. A correspondence is determined between the coordinate system of the imaging region and the coil array. At least one additional slice to be imaged is selected in accordance with the first image display. Properties of the coils of the coil array are compared with selected slice information when a coil of the array is selected in accordance with the comparison. A resonance excitation imaging sequence is conducted and the resultant resonance signals are monitored with the selected coil. An image representation is reconstructed from the resonance signals monitored by the selected coil.

In accordance with a more limited aspect of the present invention, the comparing step includes comparing properties of each coil of the array stored in a look up table.

One advantage of the present invention is that it is user friendly.

Another advantage of the present invention is that it is operator invisible. The computer automatically selects the most appropriate coil of the coil array for each slice of an imaging procedure without operator input or control.

Another advantage of the present invention resides in its flexibility. Any one of a wide variety of coil arrays may be used in a diagnostic scanner without altering the diagnostic scanner or its control systems.

Another advantage of the present invention is that it simplifies magnetic resonance imaging procedures.

Yet another advantage of the present invention is that it eliminates operator error in coil selection.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENT

Figure 1:
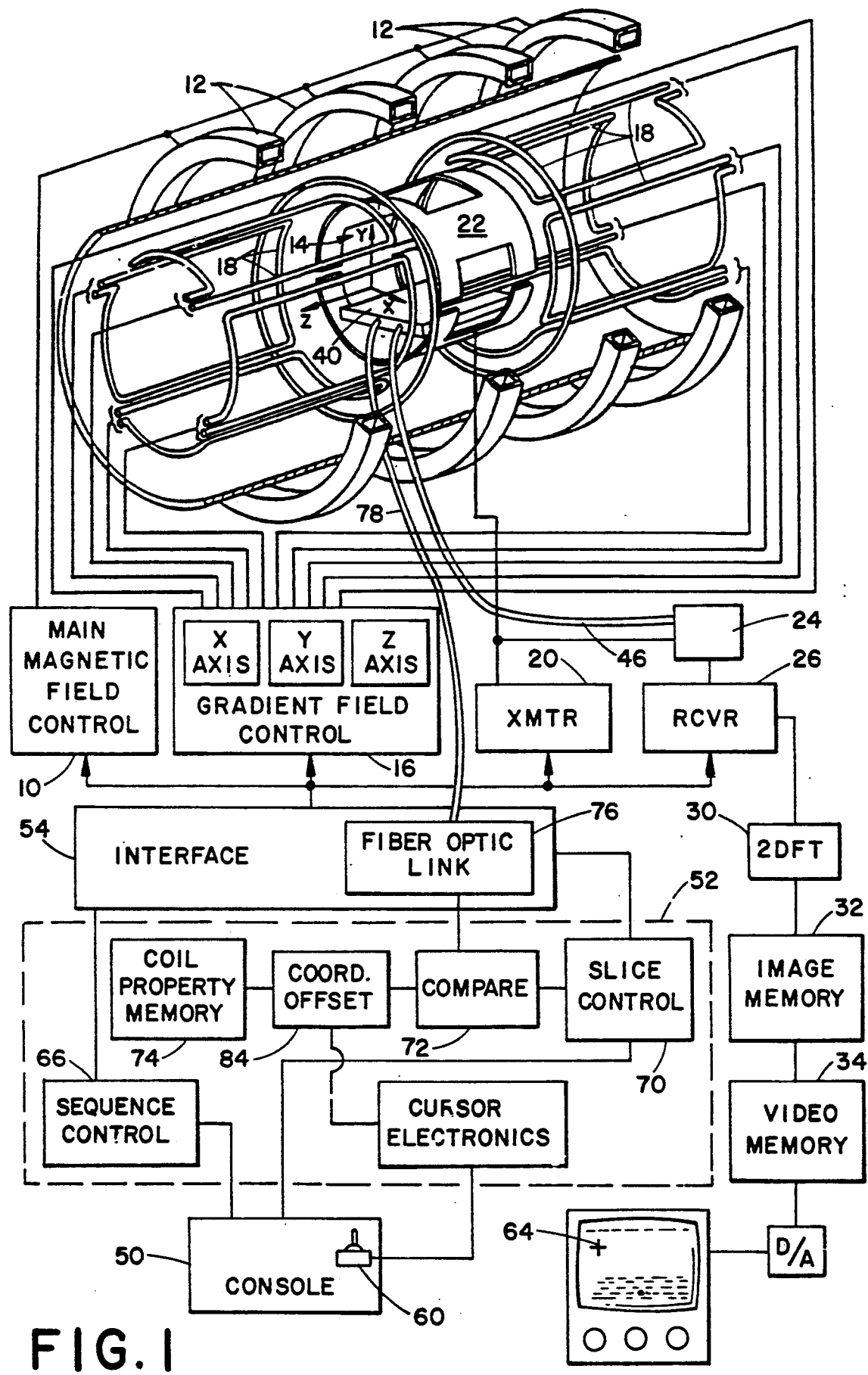
FIG. 1 is a diagrammatic illustration of a magnetic resonance imaging apparatus in accordance with the present invention.

With reference to FIG. 1, a magnetic resonance imaging apparatus includes a main magnetic field control means 10 for controlling a plurality of superconducting or inductive magnets 12 to create a static, linear main magnetic field through an imaging region 14. A gradient field control means 16 applies current pulses to selected gradient coils 18 in order to create gradients across the main magnetic field along x, y, and z axes.

A radio frequency transmitter means 20 selectively provides radio frequency pulses to a whole body antenna coil 22 for inducing magnetic resonance therein. In a whole body mode, a switching means 24 connects the whole body antenna 22 with a radio frequency receiver 26. In this manner, the whole body coil 22 acts as a pick up to receive resonance signals emanating from resonating dipoles within. In the preferred embodiment, the whole body coil 22 is used as a pick up coil for pilot or set up images.

An image reconstruction means 30 operates on the received magnetic resonance signals with an inverse two dimensional Fourier transform or other appropriate reconstruction algorithm to generate an electronic image representation that is stored in an image memory 32. Electronic image representation from the image memory 32, generally a DRAM or disk memory, are selectively transferred to a video memory means 34, typically a VRAM. The video memory means communicates image data to a video monitor 36 at video rates.

Figure 2:
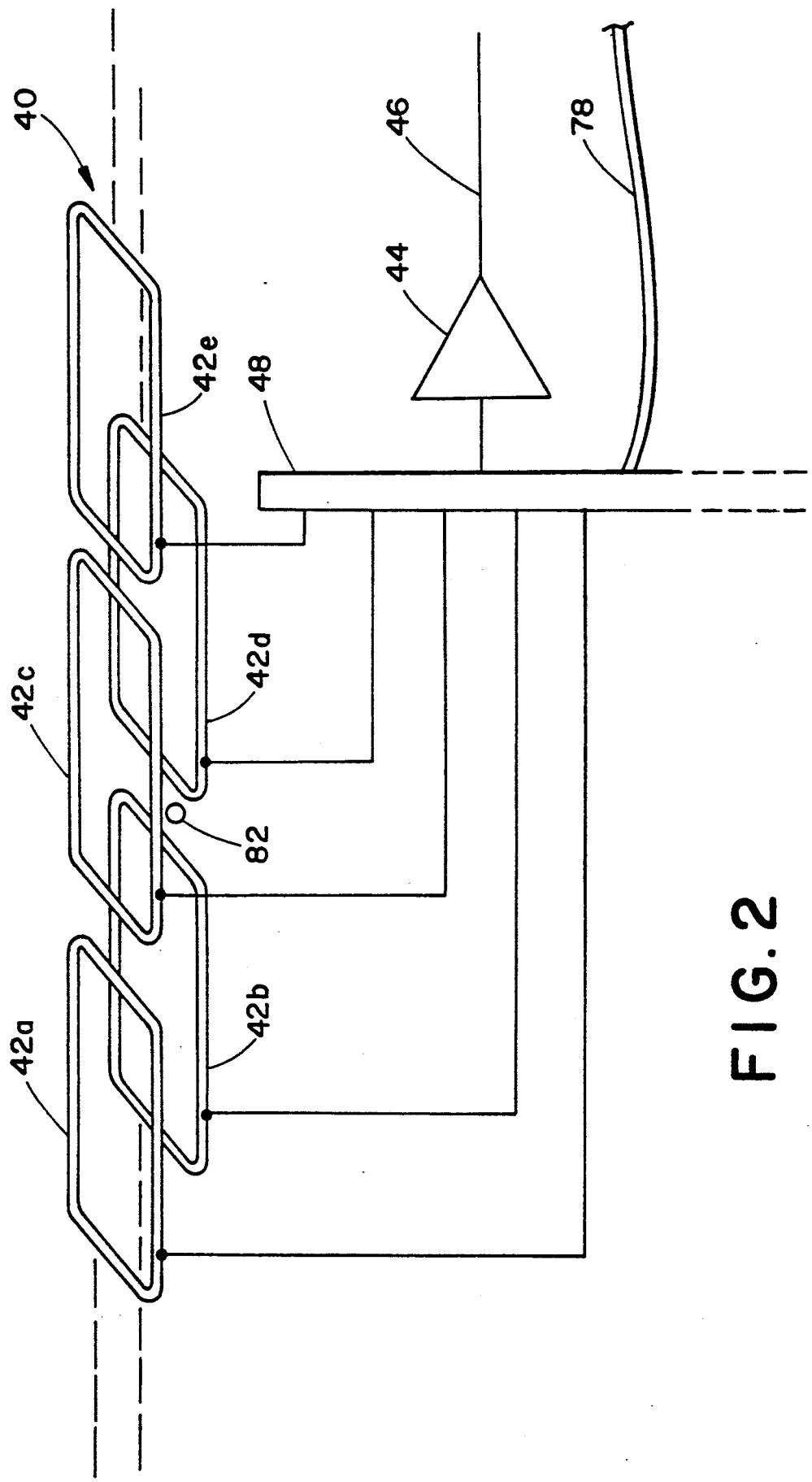
FIG. 2 is a diagrammatic illustration of the surface coil array and interface.

With continuing reference to FIG. 1 and further reference to FIG. 2, the switching means 24 connects a surface or localized coil array 40 with the receiver 26. The localized coil array includes a plurality of coils 42a, 42b, 42c, etc. Each coil is connected by a preamplifier with an output lead 46 which extends from the coil array 40 in the imaging region to the external switching means 24. A coil array switching means 48 causes the output of a selected coil or selected coils to be transferred to the output lead 46. In the illustrated embodiment, the switching array includes switches interconnected between the coils and the preamplifier such that only one coil supplies a signal to be amplified. Alternately, the coil array switching means switches an operating potential to a selected one or more of a plurality of preamplifiers each connected with an associated coil such that only a selected one(s) of the preamplifiers amplifies and passes the received signal to the output cable 46. Although illustrated as a planar array, other arrays are contemplated. In one embodiment, a pair of coil arrays are disposed on opposite sides of the head for mouth and jaw examination. A flexible chain of coils are selectively wrapped around a patient's chest or other region of interest.

With reference again to FIG. 1, an operator inputs appropriate control information on an operator console 50. The input information typically includes the type of imaging sequence to be performed, defines the location of the slice, multiple slices, or volume to be imaged, and the like. A computer control means 52 specifies the timing and properties gradient fields and RF pulses and determines which coil or coils of the coil array 40 should be active during each portion of an imaging routine, such as during each slice. A computer hardware interface means 54 applies computer control signals to the gradient field control means 16, the transmitter 20, the switching means 24, the receiver 26, and the switching means 48 of the gradient coil array.

The operator control panel 50 includes a trackball 60. Movement of the trackball 60 causes cursor electronics 62 to output appropriate control signals to the video memory 34 to superimpose a cursor 64 on the video image displayed on monitor 36. The cursor might typically be a plus, cross, a dot, or the like whose position is changed by moving the trackball 60. The computer means includes a sequence means 66 which converts the operator selected sequence into timing, gradient, and RF pulse signals.

The localized coil selection may be based on any of numerous parameters. Selection of the coil based on its field of view is illustrated in the following description by way of example. The operator inputs on the console 50 the command to generate a pilot scan, such as a longitudinal, vertical slice using the whole body coil 22. The resultant image from the longitudinal slice is displayed on the video monitor 36. The operator uses the trackball to position the cursor at each position through which a transverse slice is to be taken. At each slice position, the operator inputs a slice command to distinguish those positions of the moving cursor at which slices are to be taken. A slice control means 70 receives the designations of the coordinates through which slices are to be taken and produces the appropriate magnetic field gradient control signals.

A comparing means 72 compares the coordinates of each selected slice with field of view information for each of the surface coils 42 stored in a look up table means 74. That is, by comparing the selected slice coordinates with the coordinates of the center and width of the field of view of each coil, the comparing means determines in which coil's field of view the selected slice is most nearly centered. The comparing means 72 outputs the determined coil designation to the interface means 54. With regard to the surface coil selection, the interface means includes a fiber optic to electrical switching control means 76 which converts a fiber optic output of the comparing means into an electrical signal which is transmitted on a cable 78 to the switching means 48.

An aligning means aligns the coordinate system of the surface coil with the coordinate system of the magnetic resonance scanner, in which coordinate system the slices are designated. The aligning means includes a marker means 82 disposed at a preselected location in the coil array 40. The marker means is preferably a vial of a solution that resonates in the normal imaging sequence to produce a mark that is readily identifiable in the resultant image. The mark can be readily identifiable because of its brightness or other magnetic resonance property. Alternately, the mark can be identifiable based o its shape, such as a cross pattern. The look up table 74 is preprogrammed with the field of view specified in relation to a coordinate system identified by the marker means 82. Preferably, the marker means is located at the origin of the coil array coordinate system. In order to bring the coordinate system of the scanner and the surface coil into alignment, the trackball 60 is operated to place the cursor 64 on the mark of the video monitor image attributable to the marker means 82. This positioning of the cursor designates the relationship of the coil array and scanner coordinate systems, e.g. designates in the scanner coordinate system the location of the origin of the coil array coordinate system. A coordinate adjustment or offset means 84 is provided between the comparing means and one of the look up tables 74 and the slice control means 70. The coordinate offset means adjusts, such as by adding or subtracting, the coordinate values indicated when the cursor overlaid the mark. It is to be appreciated, that the position of the mark on the screen can also be determined automatically if the marker is machine identifiable.

Figure 3A:
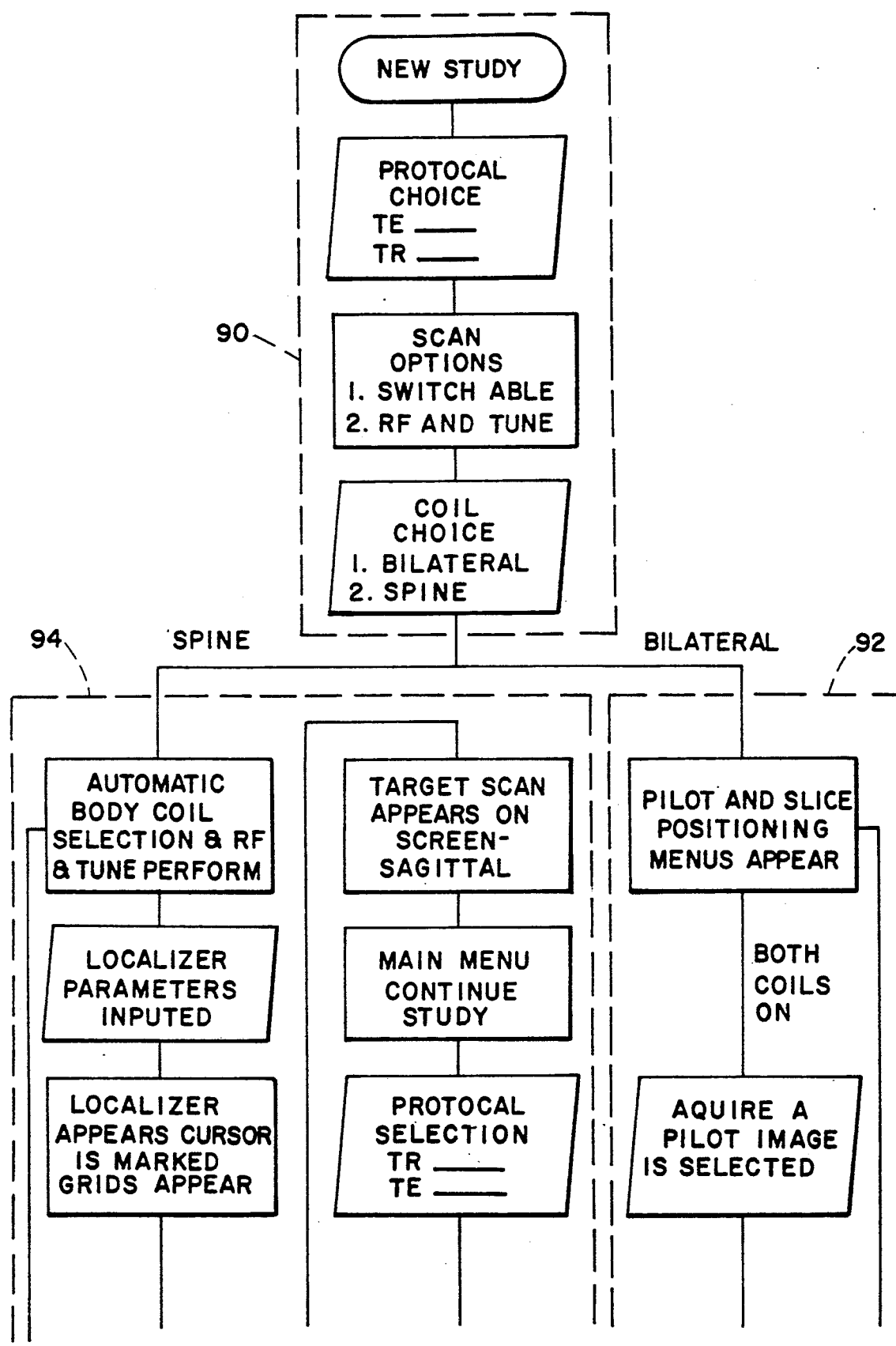
FIGS. 3A and 3B taken together are a flow chart of a computer program for implementing the present invention.
Figure 3B:
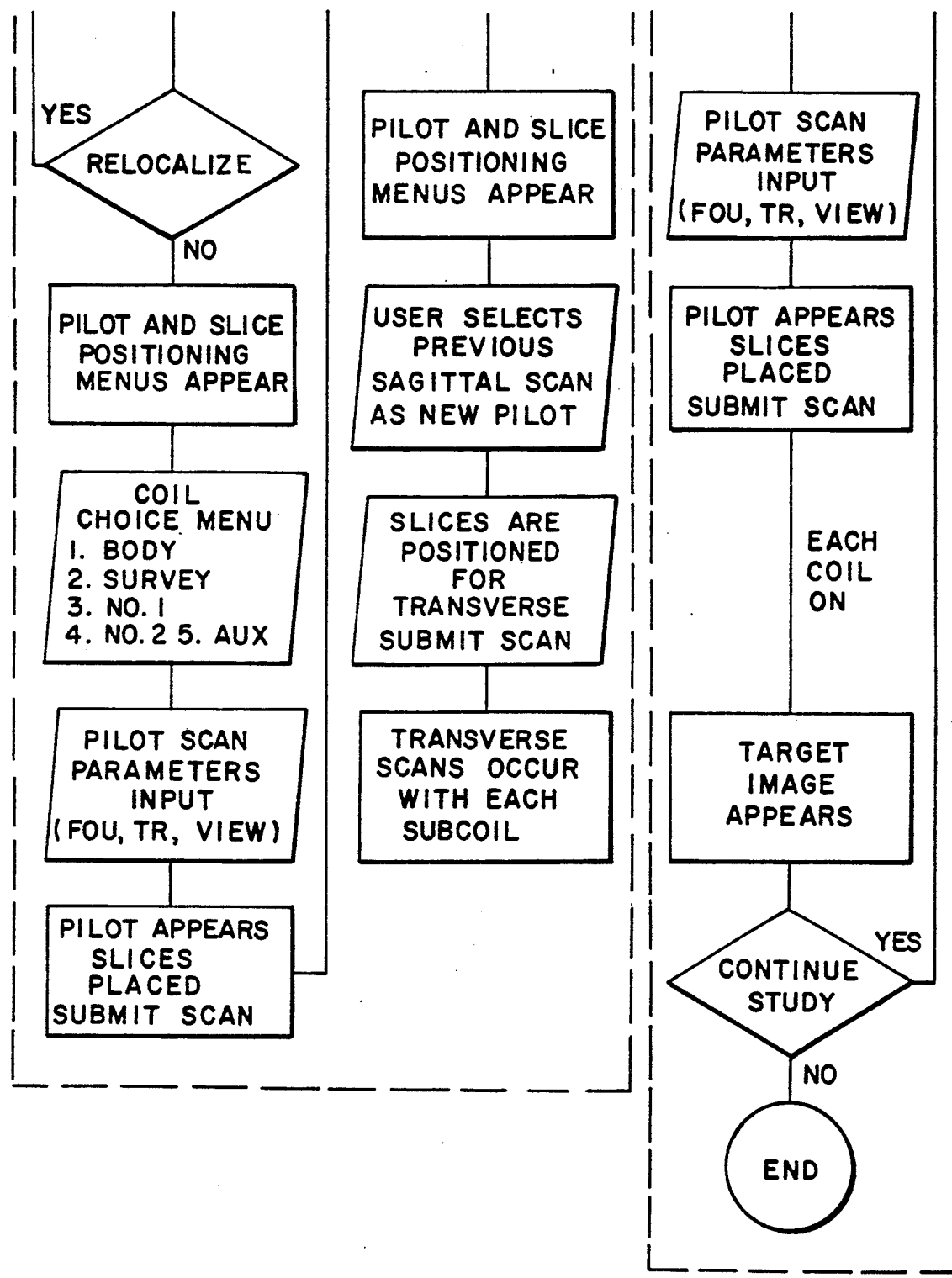

With reference to FIGS. 3A and 3B, the computer means performs a series of preliminary steps 90 to provide the operator with information regarding the selection options and ascertain whether a bilateral or transverse spine scan is to be conducted. The pilot and slice selection positioning scans are conducted utilizing steps 92 to generate the bilateral or longitudinal pilot scan image as discussed above. Once the slices have been designated on the bilateral image, a series of transverse slices are taken using spine imaging steps or means 94.

In use, the operator selects the protocol and all the associated parameters including the coil type from the console 50. The operator then runs a localizer scan. The localizer scan activates the whole body antenna 22 as described above for a large field of view image. This large field of view image allows the operator to mark the position of the coil relative to the reference point, preferably as indicated above by noting the position of the image from the small vial 82. The system uses the look up table 74 which contains information about a particular coil array 40 being used including the number of subcoils, dimensions in three planes, the reference point, and the effective fields of view in three imaging planes. The system then requests the operator to run a pilot scan in any of the three imaging planes. The appropriate coil for the pilot scan is activated dependent upon the look up table parameters. In most cases, the pilot field of view is larger than the scan field of view and the whole body antenna 22 is used. The pilot acquisition is reconstructed and the system places grids on the pilot image to show the user where each coil 42 of the coil array 40 is located in relation to the patient. The user freely marks the slice positions on the pilot or localizer images. Spine scans are then run with the computer system 52 automatically selecting the optimal coil for each slice based upon the slice positions and the effective fields of view for each coil. Further acquisitions on the same patient can be run using a similar process with all the switching among coils 42 transparent to the operator.

It is to be appreciated, that a complete set of views or data lines need not be collected sequentially. Rather, the system may alternate between two or more slices, preferably physically displaced slices, to allow a longer recovery time between contiguous view or data lines. When alternating among slices, the computer means 52 switches among the coils 42 to select the best coil for each view. Where appropriate, two coils can be selected concurrently and their output summed to produce an optimal response. As yet another alternative, second or additional radio frequency receivers may be provided. With multiple receivers, a corresponding number of coils 42 may be active concurrently, each connected to a different one of the receivers. If the operator attempts to select a slice which is out of the field of view of all coils, an appropriate display appears on monitor 36.

The foregoing description of the preferred embodiment focused on matching field of view requirements of the coils. Of course, numerous other coil criteria can be matched, not only imaging criteria but also spectroscopy criteria. For example, the coil with the highest signal to noise ratio may be selected for each slice or view. Other criteria include the highest signal to noise at a given point within the field of view, the size of the slice versus the effective field of view of the coil, the best signal to noise over a user defined region of the field of view, combining multiple slices into a larger weighted slice, and the like. Preferably, the control panel 50 is connected with the interface 76 such that the operator can override the computer selected coils. As discussed above, the pilot or locating scan images not only the vial within the coils, but also the coil outlines. This provides the operator with an indication of the coil versus body position. The operator may opt to elect a coil based on his own criteria rather than those of the computer.

In yet another alternate embodiment, the comparing means 72 determines whether a selected slice is outside of the imaging region. If the slice is outside the imaging region, a display to this effect is caused to appear on the monitor 36. Automatically or with operator interface, the patient support couch can be caused to move such that the selected slice is brought into the imaging region. As yet another alternative, the comparing means 72 can control a patient couch drive to center each slice automatically in the field of view of one of the coils by shifting the patient couch.

The invention has been described with reference to the preferred embodiment. Obviously, modifications and alterations will occur to others upon reading and understanding the preceding detailed description. It is intended that the invention be construed as including all such alterations and modifications insofar as they come within the scope of the appended claims or the equivalents thereof.

Having thus described the preferred embodiment, the invention is now claimed to be:

1. A magnetic resonance apparatus comprising:
   a means for creating a primary magnetic field through an examination region;
   a means for creating magnetic field gradients across the examination region;
   a whole examination region antenna for transmitting radio frequency signals into and receiving radio frequency signals from the examination region;
   a transmitter means for selectively supplying radio frequency signals to the whole region antenna;
   a coil array disposed in the examination region, the coil array including a plurality of independently operable coils and a switching means for interconnecting each selected coil with a radio frequency receiver;
   a data reconstruction means operatively connected with the receiver for processing received data;
   a memory means for storing the processed data for selective display on a video monitor;
   an operator console on which an operator enters magnetic resonance procedure and sequence information;
   an automatic coil selection means for controlling the switching means to select among the coils in accordance with the operator selected procedure and sequence information.

2. The apparatus as set forth in claim 1 wherein the automatic selection means includes a coil parameter storage means for storing at least one parameter for each coil of the array; and
   a comparing means for comparing stored coil parameters with the procedure and sequence information, the comparing means controlling the switching means in accordance with the comparison.

3. The apparatus as set forth in claim 2 wherein the examination region, operator console, and video monitor have a first coordinate system by which locations of the subject within the examination region are identified and wherein the coil array has a second coordinate system by which locations of coils in the array are identified and further including an aligning means for aligning the first and second coordinate systems.

4. The apparatus as set forth in claim 3 wherein the aligning means includes a means for determining a location of a preselected point of the coil array in terms of the first coordinate system.

5. The apparatus as set forth in claim 4 wherein the preselected point of the coil array is marked by a small region of material having a preselected magnetic resonance response such that the material is observable on the video monitor display.

6. The apparatus as set forth in claim 5 wherein the material includes a vial filled with a magnetic resonance responsive solution.

7. The apparatus as set forth in claim 4 further including a coordinate offset means operatively connected between the comparing means and one of the look up table and operator console for offsetting coordinates in one of the coordinate systems before performing the comparing step.

8. The apparatus as set forth in claim 7 further including:
   a material mounted at the preselected location in the coil array, which material has an identifiable magnetic resonance response that is readily identifiable in an image displayed on the video monitor;
   a trackball means for moving a cursor displayed on the video monitor, which cursor is positionable superimposed on a display of the magnetic resonance responsive material, to indicate the relationship between the whole region antenna and the coil array.

9. The apparatus as set forth in claim 1 wherein the examination region has a coordinate system by which locations within the examination region are identified and wherein the coil array has a second coordinate system by which locations of coils are identified and further including an aligning means for aligning the first and second coordinate systems.

10. The apparatus as set forth in claim 9 wherein the aligning means includes a means for determining a location of a preselected point of the coil array in the first coordinate system.

11. The apparatus as set forth in claim 10 further including a small region of material having a preselected magnetic resonance response disposed at the preselected point of the coil array.

12. The apparatus as set forth in claim 11 further including a coordinate offset means operatively connected between the comparing means and one of the look up table and operator console for providing a coordinate offset in one of the coordinate systems before performing the comparing step.

13. The apparatus as set forth in claim 12 wherein the data reconstruction means generates an electronic image representation which the video monitor converts into a man-readable image display and further including:
   a material mounted at the preselected location in the coil array, which material has an identifiable magnetic resonance response which causes readily identifiable mark on the man-readable image display on the video monitor;
   a trackball means for moving a cursor on the video monitor man-readable display, which cursor is superimposable on the mark to indicate the relationship between the coordinate system of the whole region coil and the coordinate system of the coil array.

14. The apparatus as set forth in claim 1 wherein the coil array includes a vial filled with a magnetic resonance responsive solution.

15. A method of magnetic resonance imaging, the method comprising:
   disposing a local coil array in an imaging region in a whole imaging region RF antenna;
   disposing a portion of a subject to be imaged in the imaging region;
   causing magnetic field gradients across the imaging region and applying radio frequency signals through the whole region coil to encode and excite magnetic resonance of selected dipoles of the subject;
   receiving magnetic resonance signals with the whole region coil and reconstructing the received signals into a first image representation of a portion of the subject and the coil array in the imaging region;

determining a correspondence between a coordinate system of the imaging region and the coil array;

selecting at least one additional slice to be imaged in accordance with the first image display;

comparing properties of coils of the coil array with selected slice information and selecting a coil of the array in accordance with the comparison;

conducting a resonance excitation imaging sequence and monitoring resultant resonance signals with the selected coil;

reconstructing the resonance signals monitored with the selected coil into an image representation.

16. The method as set forth in claim 15 wherein the coil array has a marker that is readily identifiable in the resultant image and wherein the coordinate system correspondence determining step further includes moving a cursor on the image display until the cursor and an image of the marker are superimposed.

17. The method as set forth in claim 15 further including storing the properties of each coil of the array in a look up table and wherein the comparing step includes accessing the look up table.

18. The method as set forth in claim 15 wherein the slice selecting step includes selecting a plurality of slices and wherein the comparing step includes comparing a field of view property of each coil with a location of each selected slice to ascertain in which coil field of view each selected slice is most nearly centered.

* * * * *